(12) United States Patent  
Karawajczyk

(10) Patent No.: US 11,947,241 B2  
(45) Date of Patent: Apr. 2, 2024

(54) LONG SWEEP LENGTH DUV MICROLITHOGRAPHIC BEAM SCANNING ACOUSTO-OPTICAL DEFLECTOR AND OPTICS DESIGN

(71) Applicant: Mycronic AB, Taby (SE)

(72) Inventor: Andrzej Karawajczyk, Stockholm (SE)

(73) Assignee: Mycronic AB, Taby (SE)

( * ) Notice: Subject to any disclaimer, the term of this patent is extended or adjusted under 35 U.S.C. 154(b) by 209 days.

(21) Appl. No.: 17/599,356

(22) PCT Filed: Jan. 20, 2020

(86) PCT No.: PCT/EP2020/051218  
§ 371 (c)(1),  
(2) Date: Sep. 28, 2021

(87) PCT Pub. No.: WO2020/200530  
PCT Pub. Date: Oct. 8, 2020

(65) Prior Publication Data  
US 2022/0197108 A1 Jun. 23, 2022

Related U.S. Application Data

(60) Provisional application No. 62/826,840, filed on Mar. 29, 2019.

(51) Int. Cl.  
*G02F 1/33* (2006.01)  
*G03F 7/00* (2006.01)

(52) U.S. Cl.  
CPC ............ *G02F 1/332* (2013.01); *G03F 7/7015* (2013.01); *G03F 7/70383* (2013.01)

(58) Field of Classification Search  
CPC ...... G03F 7/7015; G03F 7/70383; G02F 1/33; G02F 1/332; G02F 1/11; G02F 1/29; G02F 1/294; G01N 21/8806; G01N 21/9501  
See application file for complete search history.

(56) References Cited

U.S. PATENT DOCUMENTS

| 3,799,652 A | 3/1974 | Torguet |
| 4,112,461 A | 9/1978 | Owens |

(Continued)

FOREIGN PATENT DOCUMENTS

| EP | 1467235 A1 | 10/2004 |
| JP | S5915922 A | 1/1984 |

(Continued)

OTHER PUBLICATIONS

PCT/EP2020/051218—Interational Search Report and Written Opinion dated Mar. 30, 2020, 9pgs.

(Continued)

*Primary Examiner* — Deoram Persaud  
(74) *Attorney, Agent, or Firm* — Haynes Beffel & Wolfeld LLP; Ernest J. Beffel, Jr.

(57) ABSTRACT

The technology disclosed uses extreme beam shaping to increase the amount of energy projected through an AOD. First and second expanders and are described that are positioned before and after the AOD. In one implementation, the optical path shapes energy from a source, such as a Gaussian laser spot, deflects it, then reshapes it into a writing spot. In another implementation for image capture, rather than projection system, the disclosed optics reshape a reading spot from an imaged surface to a high-aspect ratio beam at an AOD exit, subject to deflection by the AOD. The optics reshape the radiation relayed by the high-aspect ratio beam through the AOD to a detector. Since light can travel in both directions through an optical system, the details described in terms of projecting a writing spot onto a radiation sensitive surface also apply to metrology sweeping a reading spot over an imaged surface.

15 Claims, 8 Drawing Sheets

(56) References Cited

U.S. PATENT DOCUMENTS

| | | | |
|---|---|---|---|
| 4,206,347 A | | 6/1980 | Avicola et al. |
| 4,691,212 A | * | 9/1987 | Solcz .................. G06K 7/10653 |
| | | | 347/250 |
| 4,827,125 A | * | 5/1989 | Goldstein .......... G02B 21/0036 |
| | | | 250/234 |
| 6,091,067 A | * | 7/2000 | Drobot ................... G02B 26/10 |
| | | | 250/234 |
| 6,307,799 B1 | * | 10/2001 | Ngoi ..................... G11B 7/0033 |
| | | | 369/111 |
| 6,700,600 B1 | | 3/2004 | Sandstrom et al. |
| 7,642,484 B2 | | 1/2010 | Gross et al. |
| 7,826,130 B2 | | 11/2010 | Schweitzer et al. |
| 8,891,157 B2 | | 11/2014 | Sandstrom |
| 8,958,052 B2 | | 2/2015 | Sandstrom |
| 2002/0180869 A1 | * | 12/2002 | Callison ............... H04N 9/3129 |
| | | | 348/E9.026 |
| 2003/0011672 A1 | * | 1/2003 | Emge ...................... B41M 5/26 |
| | | | 347/241 |
| 2007/0138151 A1 | * | 6/2007 | Tanaka ................. B23K 26/082 |
| | | | 219/121.73 |
| 2009/0142765 A1 | * | 6/2009 | Vacca ................. G01N 15/1434 |
| | | | 435/6.12 |
| 2012/0086937 A1 | | 4/2012 | Feldman et al. |
| 2012/0281195 A1 | | 11/2012 | Sandstrom et al. |
| 2013/0342893 A1 | | 12/2013 | Feldman et al. |
| 2014/0260640 A1 | | 9/2014 | Sullivan et al. |
| 2022/0221796 A1 | * | 7/2022 | Xiong ................. G02B 27/0031 |

FOREIGN PATENT DOCUMENTS

| | | | |
|---|---|---|---|
| JP | S62232611 A | 10/1987 | |
| WO | 2009156225 A1 | 12/2009 | |

OTHER PUBLICATIONS

Marshall et al, Handbook of Optical and Laser Scanning 2nd ed., Chap 11, 2012, Taylor & Francis Group LLC, 206 pgs.

Kanel, G.I. et al, Response of Seven Crystallographic Orientations of Sapphire Crystals to Shock Stresses of 16 to 86 GPa. Journal of Applied Physics. 106(4), 043524-043524. 10.1063/1.3204940, Sep. 2009, 19pgs.

Gooch & Housego, Quartz AOD 4170 Quartz 355nm datasheet 97-03255-02-Rev-1, Apr. 4, 2016 [downloaded Dec. 18, 2018 from https://goochandhousego.com/product-categories/deflectors-aodf].

Gooch & Housego, Deflectors (AODF), 5 pgs [downloaded Dec. 18, 2018 from https://goochandhousego.com/product-categories/deflectors-aodf].

Gooch & Housego, AODF 4200-6, 266nm datasheet 4200_UV_97_002890_02_Rev_A, Sep. 20, 2006, 1pg [downloaded Dec. 18, 2018 from https://goochandhousego.com/product-categories/deflectors-aodf].

Encyclopedia of Laser Physics and Technology—numerical aperture, NA, optical fiber, lens, objective, acceptance angle, 2 pgs [downloaded Dec. 18, 2018 from https://www.rp-photonics.com/numerical_aperture.html].

EP20701315.2—Office Action dated Jul. 11, 2023, 8 pages.

Bradley E Losavio et al, "Acousto-optic laser scanning for multi-site photo-stimulation of single neurons in vitro", Journal of Neural Engineering. 7 (2010) 045002 (12pp) [dm:10.1088/1 741-2560/7/4/045002].

CN 202080038519.2, Office Action dated Sep. 19, 2023.

* cited by examiner

| Property | Value |
|---|---|
| Wavelength | 266nm |
| Entrance pupil diameter | 4-6 mm |
| Exit pupil size in X | 0.5 – 2. mm |
| Exit pupil size in Y | 20-60 mm |
| Working distance front (Entrance pupil to flange) | Compliant with system design(approx. 20 mm) |
| Working distance rear (Exit pupil to flange) | Compliant with system design(approx. 30 mm) |
| Total track length | Per design (approx. 347 mm) |
| Field of view entrance aperture in Y (+/-) | 0 deg |
| Field of view entrance aperture in X (+/-) | 0.1 – 1.5 deg |
| Boresight error in X(max) *(see Note A)* | < 0.1 – 1 mRad |
| Boresight error in Y(max) *(see Note A)* | < 0.1 – 1 mRad |
| Angular magnification in X *(see Note B)* | -0.16 – -0.25 |
| Angular magnification in Y *(see Note B)* | -4.16 – -12.5 |
| Beam collimation *(see note C)* | < 0.1 – 0.5 mRad |
| Transmission @ 266 nm | > 60-80% |
| Weight | < 500 – 1000 g |
| Max mechanical dimensions | Compliant with system specification |

Notes
A. Beam deviation relative to the mounting flange
B. Defined as image height to object height ratio.
C. Defined as max difference of the ray intersection angle with the chief ray intersection angle in the lens image plane

FIG. 6

| Property | Value |
|---|---|
| Wavelength | 266nm |
| Entrance pupil diameter | 4 – 6 mm |
| Exit pupil size in X | 0.5 – 2 mm |
| Exit pupil size in Y | 20 - 60 mm |
| Working distance front (Entrance pupil to flange) | Compliant with system design(approx. 30 mm) |
| Working distance rear (Exit pupil to flange) | Compliant with system design(approx. 20 mm) |
| Total track length | Peer design (approx. 403 mm) |
| Field of view entrance aperture in Y (+/-) | 0.1 – 1.5 deg |
| Field of view entrance aperture in X (+/-) | 1.0 – 4.0 deg |
| Boresight error (see note A) | < 0.1 – 1 mRad |
| Angular magnification in X *(see Note B)* | -4.0 – -6.0 |
| Angular magnification in Y *(see Note B)* | -0.08 – -0.24 |
| Beam collimation *(see note C)* | < 0.1 – 1.0 mRad |
| Transmission @ 266 nm | > 60% - 80% |
| Weight | < 500 – 2000 g |
| Max mechanical dimensions | Compliant with system specification |

Notes

A. Beam deviation relative to the mounting flange
B. Defined as image height to object height ratio.
C. Defined as max difference of the ray intersection angle with the chief ray intersection angle in the lens image plane

FIG. 7

LONG SWEEP LENGTH DUV MICROLITHOGRAPHIC BEAM SCANNING ACOUSTO-OPTICAL DEFLECTOR AND OPTICS DESIGN

CROSS-REFERENCE

This application is the U.S. National Stage of International Application No. PCT/EP2020/051218, filed 20 Jan. 2020, which claims priority to U.S. Application No. 62/826,840, filed 29 Mar. 2019.

FIELD OF TECHNOLOGY

The technology disclosed relates to acousto-optical deflection devices and associated optical components used for pattern generation, direct-write microlithography and projection of radiation onto a photosensitive surface to form a latent image. In particular, the technology relates to high-precision pattern generators and direct writers using acousto-optical deflectors (AODs). The AODs are used for patterning of photomasks, wafers, printed circuit boards (PCBs), fine-pitch interconnection substrates, flexible substrates with or without active components (transistors) and/or of panels for displays, photovoltaics and illumination. Other pattern generators with line widths from 0.03 to 10 microns also can use the technology disclosed.

The technology disclosed can be used to collect image information from an imaged surface, as opposed to projecting radiation onto a photosensitive surface.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may correspond to implementations of the claimed technology also.

Writing masks and microlithographic direct writing to substrate devices involves scanning radiation over a radiation sensitive surface to form a latent image. The design of scanner mechanisms depends both on the wavelength of the projected radiation and service requirements for scan length. Electrons, with a particle/wave duality, have extremely short wavelength and typically are scanned using an electrical or magnetic field. Two other mechanisms for scanning are a rotating mirror with multiple facets and an AOD.

An AOD periodically applies a high-frequency acoustic wave, over one million Hz, to a crystal to modify its optical properties. A complex relationship between the crystal medium, the projected radiation frequency and the acoustic wave governs the optical properties and scanning performance of the acousto-optical medium.

Use of shorter frequency radiation, in the deep ultraviolet range, to expose smaller and smaller features on substrates requires a new design, because the acousto-optical media used in legacy pattern generators are not sufficiently transmissive in the deep ultraviolet (DUV) spectrum. The acousto-optical media that are transmissive in the deep ultraviolet spectrum produce limited ranges of angular deflection, which translates into short scan lengths and lower printing speeds. This problem is not resolved in prior scanning systems, such as the following.

U.S. Pat. No. 7,642,484 B2 (Orbotech) is an example of a system that uses a rotating mirror to scan laser pulses. An acousto-optical modulator (AOM) controls delivery of pulses to the rotating mirrors.

U.S. Pat. No. 7,826,130 B2 (Heidelberg) describes an improved AOM, as distinguished from an AOD.

Re-examined US patent Re. 33,931 (ASET) illustrates use of an AOD with multiple coherent beams spaced apart to avoid interference at the radiation sensitive surface. The frequency of the specified continuous helium-cadmium laser is given as 4416 Å, in the UV frequency range.

U.S. Pat. Nos. 8,891,157 and 8,958,052 are two of several patents assigned to applicant Mycronic or to its predecessor Micronic, for AOD designs used in its Omega, Prexision, LRS and Sigma pattern generators, which have historically used UV sources. The '052 patent calls out a $TeO_2$ crystal.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

Figure 2:
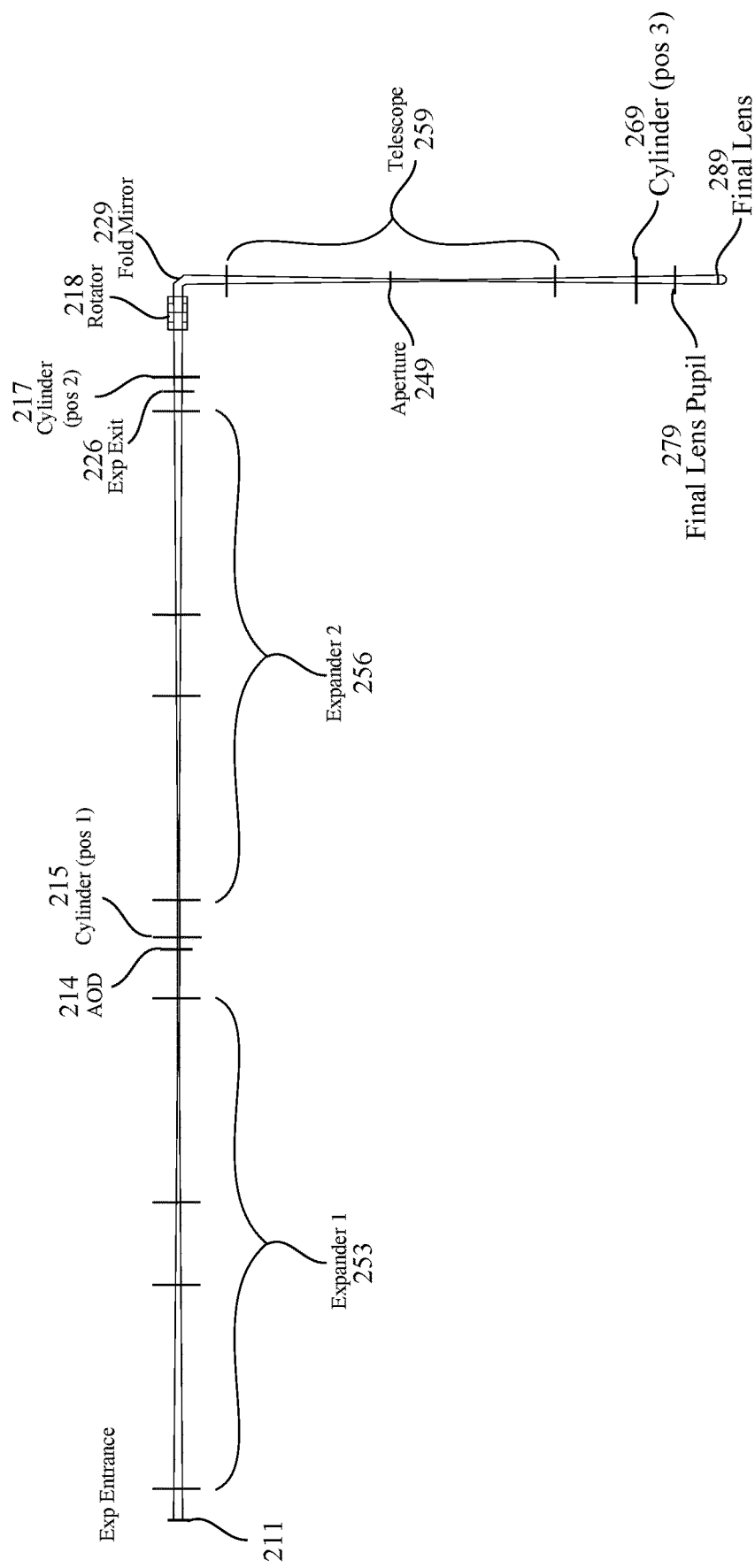

A general, schematic arrangement of components is illustrated by FIG. 2.

Figure 3:
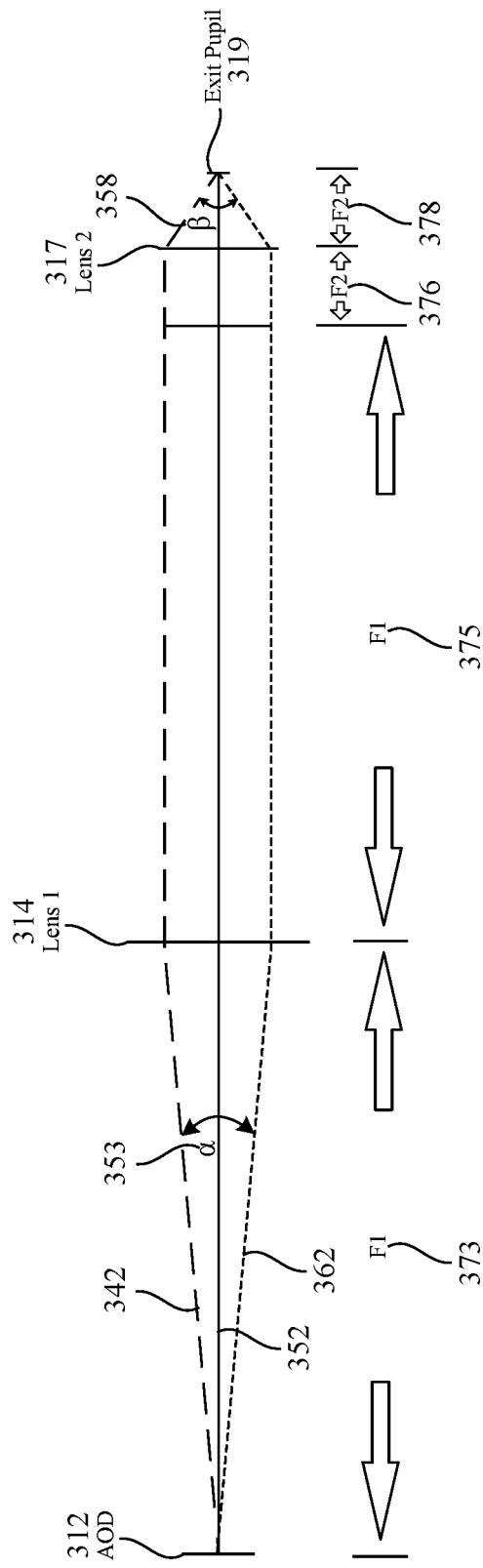
Figure 4:
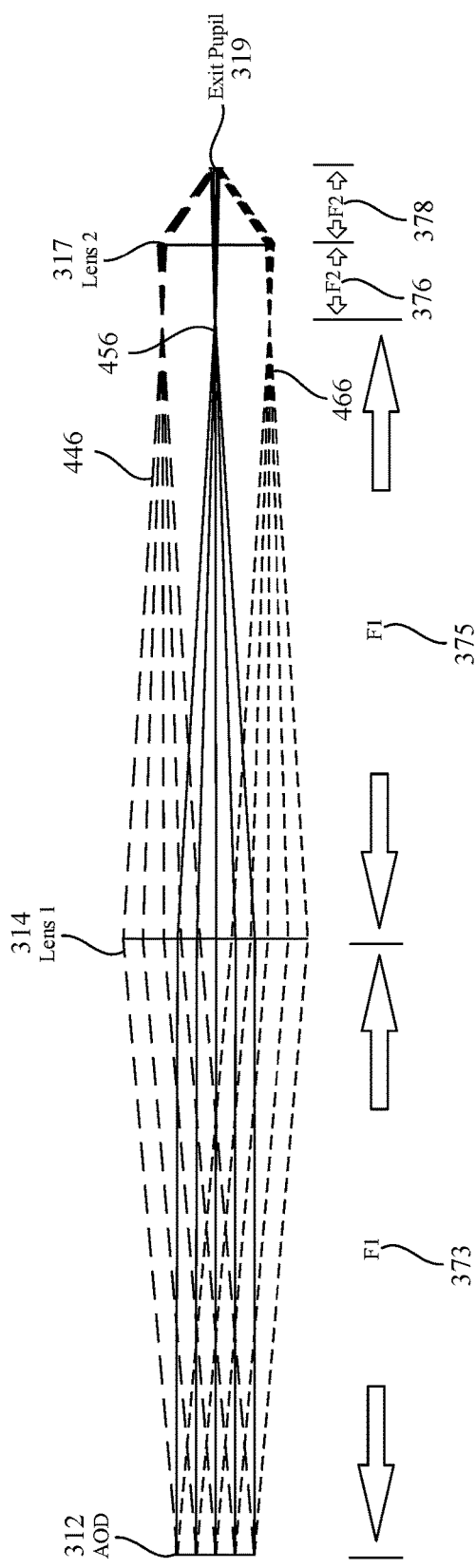
Figure 5:
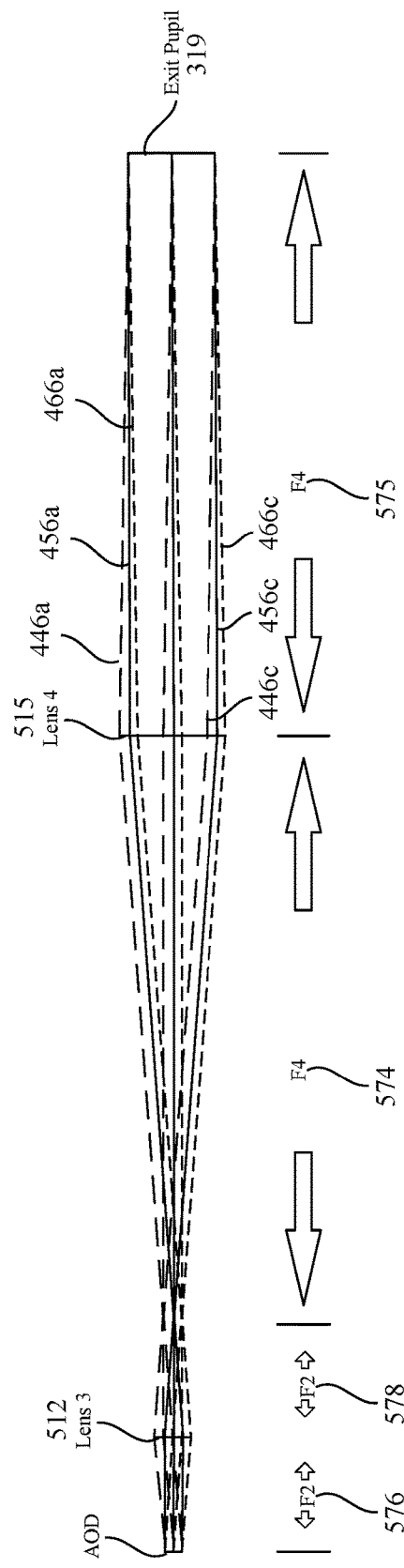

FIG. 3, FIG. 4 and FIG. 5 illustrate the beam geometry in the AOD scanning direction and in the plane perpendicular to the AOD scanning plane. The angular magnification and the imaging mechanism of the system are illustrated in FIG. 3. FIG. 4 illustrates the AOD 214 and two cylindrical lenses Lens 1 (314) and Lens 2 (317), and a beam geometry in the AOD scanning direction. FIG. 5 illustrates the beam geometry the plane perpendicular to the AOD scanning plane.

FIG. 6 and FIG. 7 are example specifications for first and second expanders, respectively.

Figure 8:
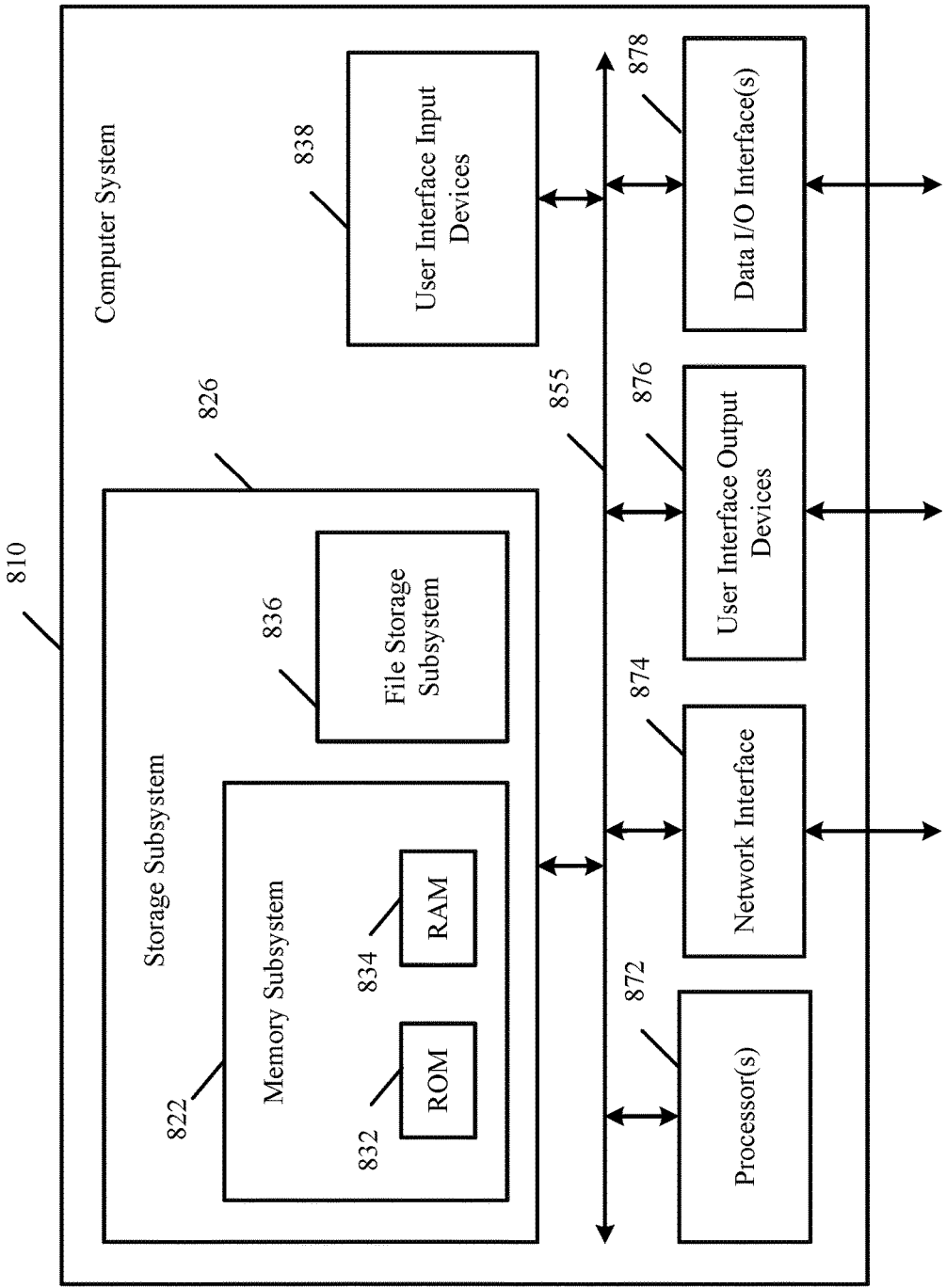

FIG. 8 depicts a block diagram of an exemplary imaging system for an acousto-optical deflector, a first expander before the AOD, a second expander following the AOD, and one or more additional lenses all aligned on an optical path, according to one implementation of the technology disclosed.

Figure 9:
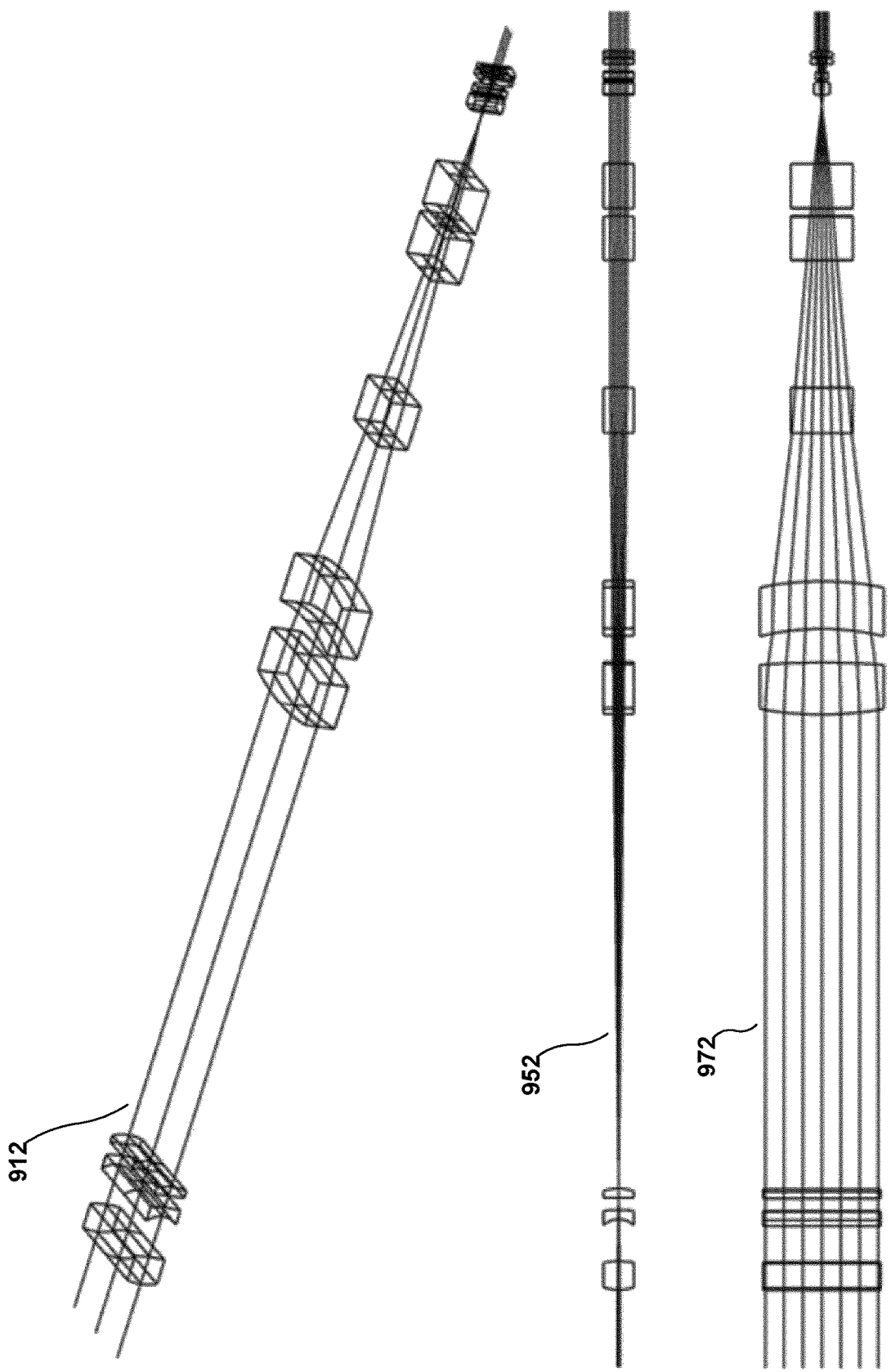

FIG. 9 illustrates a second expander lens design in an example imaging system, with a perspective view and in X and Y cross sections, according to one implementation of the technology disclosed.

DETAILED DESCRIPTION

The following detailed description is made with reference to the figures. Sample implementations are described to illustrate the technology disclosed, not to limit its scope, which is defined by the claims. Those of ordinary skill in the art will recognize a variety of equivalent variations on the description that follows.

INTRODUCTION

In view of the above, an opportunity arises to devise an optical train with expanders before and after the AOD that improves creation of latent images by scanning deep ultraviolet radiation on a radiation sensitive surface.

Large-area mask refers to a mask applied to large surfaces, such as flat-panel displays. These masks are much larger than the ones used to make chips. Large substrates are used both for flat-panel displays and for creation of numerous copies of small displays, such as cell phone displays. The feature size of components built on these substrates is decreasing as display resolution increases to approximate human retinal resolution.

One figure of merit for the scanner design incorporated in a pattern generator is the number of resolved pixels along the scan line. The greater the number of pixels resolved, the longer the scan line can be for a given feature size. The density of radiation projected impacts the number of resolved pixels. More intense radiation requires less time to expose a radiation sensitive surface. On the other hand, care must be taken not to burn or overheat the acousto-optical medium by pushing too much radiation through a fixed volume.

The technology disclosed uses extreme beam shaping to increase the amount of energy projected through the AOD and then shaped into a writing spot. First and second expanders 253 and 256 are described that are positioned before and after the AOD 214, as illustrated in FIG. 2.

A first expander 253 assembly, in one implementation, has a dozen optical elements, more or less, that are used to reshape a Gaussian laser spot into a high aspect ratio rectangular image at an AOD entrance pupil. For instance, a 4.8 mm laser spot can be imaged from circular to rectangular. In one implementation, using a commercially available AOD from Gooch & Housego (G&H), the rectangular image at the entrance pupil is 37 mm×1 mm. The laser spot is shaped to fill the opening of the AOD. Radiation projected through the high aspect ratio rectangle is deflected. Multiple high aspect ratio rectangular images can be projected at slightly different angles to normal through the same window and simultaneously deflected to produce a rake-like array of scanning spots, as illustrated in FIGS. 4-5.

A second expander assembly 256, in one implementation, also has a dozen or so optical elements, which reverse the shaping of the first expander assembly to convert the high aspect ratio rectangular image into a scanning laser spot that is generally circular. In some designs, astigmatism results from chirping the AOD, which can be corrected using a cylindrical lens or taken into account numerically when scanning the laser spot to form the latent image. FIG. 9 illustrates an example second expander lens design.

As an image capture, rather than a projection system, the disclosed second expander includes lenses that reshape a reading spot from an imaged surface to the high-aspect ratio beam at an AOD exit, subject to deflection by the AOD and the first expander includes lenses that reshape the radiation from the high-aspect ratio beam to the AOD to a detector. The additional lenses demagnify a deflection angle from a larger sweep angle of the reading spot along the imaged surface to a smaller sweep at the AOD exit.

Since light can travel in both directions through an optical system, the details described in terms of projecting a writing spot onto a radiation sensitive surface also apply to metrology sweeping a reading spot over an imaged surface. The most significant difference is using multiple detectors, such as a line camera, an area camera, a spectrometer, scatterometer or an interferometer could be used in a system that read from the workpiece instead of writing to it. All of the references that follow to a laser spot or writing spot are hereby extended to a reading spot.

The scanning laser spot is further focused to a small spot on the radiation sensitive surface 117 that is being patterned.

A reverse telescope 259 increases the angular range of scanning, as illustrated by FIG. 3. In one implementation, a scanning angle range is multiplied by 7.71 as the Y-axis of the scanning spot deflected by the AOD is compressed from 37 mm to 4.8 mm. Radiation diffracted through the relatively large, high aspect ratio rectangular opening of the AOD has sufficient energy density and resulting resolved spots to use lenses that multiply the angular range of scanning and produce a longer scan line.

AODs Used in Prior Pattern Generators

Figure 1:
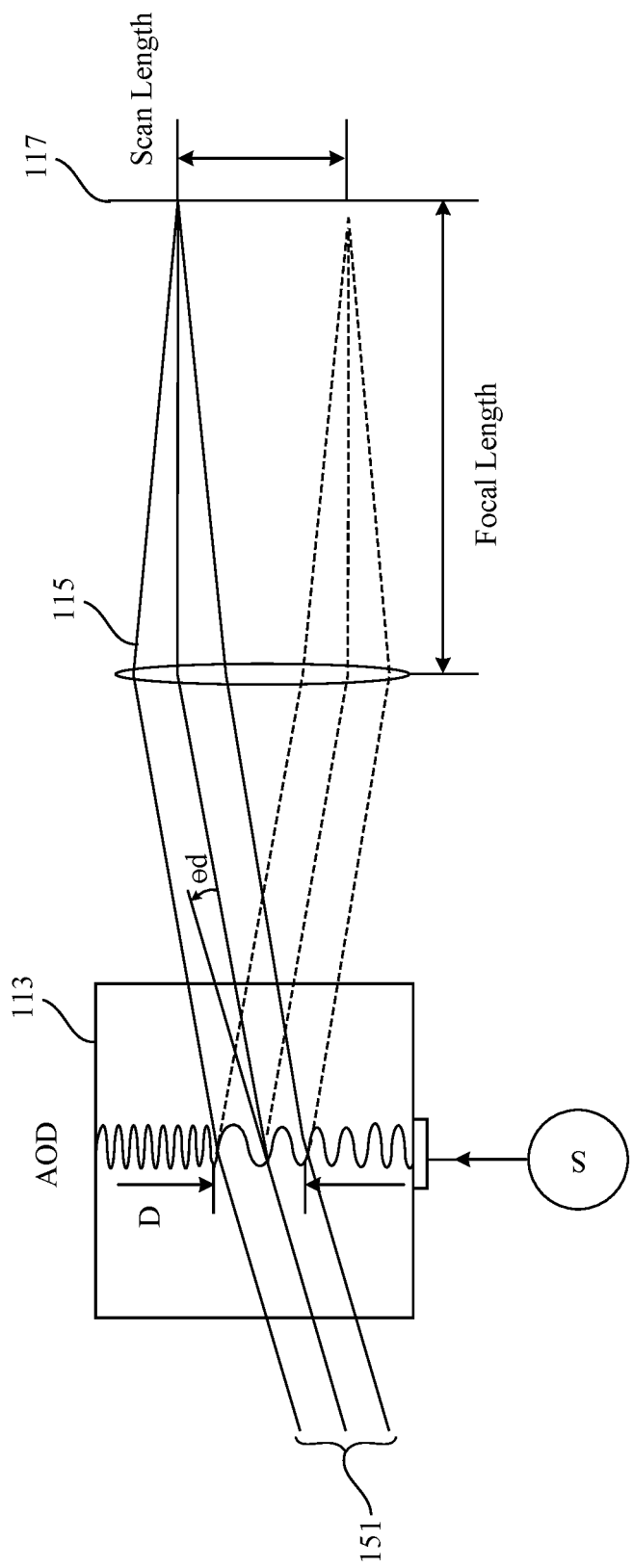
FIG. 1 illustrates an AOD design concept used in pattern generators historically sold by applicant.

FIG. 1 illustrates an AOD design concept used in pattern generators historically sold by applicant. The scanner of FIG. 1 could for example be a microlithographic laser writer for writing a pattern on a photomask, or for direct writing of a pattern on a substrate such as a printed circuit board. A laser emits a beam which is divided into multiple beams 151 by a beam-splitter. The beams are modulated by a multibeam acousto-optical modulator (AOM) and deflected by the AOD 113. The laser beam of diameter D is deflected in an AOD that uses a $TeO_2$ acousto-optical medium. The footprint of the beam in the AOD plane is circular, 4.8 mm in diameter. The deflection plane of the AOD is conjugated to the final lens pupil plane. The final lens focuses the beam in the plane of the substrate. However, the $TeO_2$ deflector is unusable at 266 nm DUV wavelength due to absorption of DUV by the acousto-optical medium.

Design Constraints Identified

Key parameters referred in design of AODs for pattern generators include:

| Parameter | Symbol |
|---|---|
| Wavelength | $\lambda$ |
| Scan length | $l_{scan}$ |
| Final lens focal length | f |
| Final lens pupil diameter | D |
| AOD RF effective bandwidth | $f_d$ |
| Width of the Gaussian beam | $W_{spot}$ |
| Sound speed | $v_s$ |
| AOD scanning angle | $\theta_d$ |

The area coverage that determines writing speed at a given resolution is a function of the number of resolved spots ($n_{spot}$) in a scan and the width ($W_{spot}$) of the Gaussian beam on a plate or on the radiation sensitive layer overlaying a substrate to be patterned. The number of resolved spots, further discussed below, defines the effective scan length, which can be expressed as a number of pixels. The width of the Gaussian beam defines the optical resolution hence the size of the pixel, which combines with the number of resolved spots in a scan line to determine the area patterned in a sweep of a scan line. Faster printing results from patterning a larger area in a given time of sweep.

The width $W_{spot}$ is chosen to meet a critical writing dimension requirement, as limited by the exposing radiation wavelength. For a particular machine, $W_{spot}$ depends on the final lens numerical aperture NA, which for single lenses is given by NA=n sin(D/2f) where n is the index of refraction. For complex lenses this relationship can be altered. In our example implementation it is close to NA=tan(D/2f).

The DUV capable AODs that are available on the market use acousto-optical media that have a high sound velocity for the high frequency acoustic signal used to cause deflection by diffraction. The speed of sound through the media inversely impacts deflection angles achieved by an AOD. A sound speed of 6320 m/s through quartz is nine times faster than through $TeO_2$. Sapphire has an even higher speed of sound, reported as 10,600 to 11,210 m/s, which we treat as ⇐11,225 m/s. These high sound speeds yield a small scanning angle, in comparison to the scanning angle of $TeO_2$ deflectors. The scan length $L_{scan}$, the AOD RF bandwidth $f_d$, the sound speed $v_s$ and the AOD scanning angle $\theta_d$ are coupled by the following equations:

$$\theta_d = \frac{\lambda \cdot f_d}{v_s}$$

$$L_{scan} = \theta_d \cdot f$$

These equations show the relationship of a high speed of sound to a small deflection angle and a short scan length.

The number of resolved spots is proportional to the AOD RF bandwidth and the pupil diameter and inversely proportional to the sound speed.

$$W_{spot} = \frac{f \cdot \lambda}{D} \cdot 1.4$$

$$n_{spot} = \frac{L_{scan}}{W_{spot}} = \frac{f_d \cdot D}{v_s \cdot 1.4}$$

Devices with small deflection angles offer low writing speed when applied to current pattern generator designs, so a new design is desirable.

Technology Disclosed

The technology disclosed leverages a deflector design that has an optical aperture with a high aspect ratio, heavily elongated in the sound propagation direction. This disclosure refers to the long side of the optical aperture as the Y-axis and the short side as the X-axis. Radiation generally passes through the aperture along or close to the Z-axis. The high aspect ratio of the optical aperture can be utilized to significantly increase the writing speed by shaping the exposing radiation beam so it fills the entrance aperture of the AOD. While the high aspect ratio in the example given is 37:1, a high aspect ratio in the range of 25:1 to 45:1 or 20:1 to 60:1 could also be used to practice the technology disclosed. The high aspect ratio chosen depends on the entrance pupil of the AOD selected. A Gaussian laser spot can be imaged from round at the laser source to rectangular with a high aspect ratio at the AOD entrance. This can be achieved by using an anamorphic optical system upstream of the deflector and can similarly be reversed downstream of the AOD.

The projected radiation, in one implementation, has a wavelength in the deep ultraviolet (DUV) spectrum of approximately 266 nm, +/−5 nm. Other coherent sources in the DUV spectrum are available with wavelengths in the range of 224.3 nm to 248.6 nm, as well is in the range of 250 nm to 350 nm.

One commercially available AOD has an opening of 37 mm×1 mm and uses quartz crystal or fused silica as the acousto-optical medium. Another acousto-optical medium that works with DUV radiation is sapphire. The technology disclosed can be used with an AOD fashion from any acousto-optical medium that is sufficiently transmissive to DUV radiation. For the AOD, sufficiently transmissive is >80 percent or, better yet, >90%. Transmission is significant to avoid heat build-up in the AOD. The sources of commercially available acousto-optical deflectors include Gooch & Housego (G&H). AODs listed on the company's website for the 266 nm wavelength include AODF 2690-UV and AODF 4200-UV. <Accessed at https://goochandhousego.com/product-categories/deflectors-aodf on Jan. 4, 2019>. Other suppliers of commercially available AODs include Isomet Corporation, Harris, Acal BFi, Brimrose Corp of America, AA Opto-Electronic, Pro-lite Technology and APE Angewandte Physik & Elektronik.

The technology disclosed enables design of a DUV laser writer that reuses much of the current violet UV pattern generator writer technology. As a result, it can utilize well proven, commercially available acousto-optical devices and yield good printing speed. It provides a technical solution for a high speed, high resolution laser lithographic writer at DUV, which utilizes the high sound speed AODs existing on the market, fits into the current architecture of PG writers, and has a lower material cost and lower degree of complexity than SLM-based writers, where SLM stands for Spatial Light Modulator.

The trick, in one implementation, can be described as: Expand a circular 4.8 mm pupil to the 37 mm rectangular size of the deflector aperture. Deflect the beam in AOD through a small deflection angle, due to a high sound speed through the AOD. Then, squeeze the 37 mm pupil back to 4.8 mm size. The deflection angle can be multiplied by a factor 37/4.8, with adequate projected energy, as shown in the FIG. 3. In other implementations, the deflection angle multiplication can be by a factor in a range of 4 to 12. A rectangular image is preferred, because it is considered unfeasible to build the quartz AOD with a circular aperture of 37 mm. The final lens for a circular pupil of 37 mm would be large, heavy and expensive. The AOD design for a circular pupil would require 37 times as many transducers as in the current device that is only 1 mm wide on the X-axis, with around 200 transducers in total, to achieve the same diffraction efficiency. The power consumption would be in a range of 200-400 watts and such a device would probably not work.

Applying the technology disclosed, the collimated input light enters the module at the expander entrance plane 211. The input beam is of the Gaussian intensity distribution and the 1/e2 diameter is around 4.8 mm. This beam is to be shaped by the first expander lens 253 to a footprint of 37×1 mm in the AOD entrance plane.

Several separated but mutually coherent input beams, produced using a beam splitter, can intersect in the expander entrance plane under small angles in X (<0.4 degrees). The beams are shaped to the 37×1 mm footprint at the AOD plane. Since the acousto-optical diffraction efficiency is sensitive to angles, each of the beams is to be highly collimated in the AOD plane. Of course, other geometries of AOD entrance can be used, as discussed above. In different words, the laser waist, where the input beams intersect, is relayed to the AOD plane.

The high aspect ratio beam illuminates the AOD, which is rotated/aligned in the X direction, in one implementation, at the Bragg angle of around 0.5 degrees. The AOD can be optically modelled with the chirped grating aligned to the input beam at the Bragg angle. The Bragg angle geometry improves the efficiency of the acousto-optical conversion process. The Bragg angle condition helps assure that the acousto-optical diffraction efficiency is high enough for the device to be usable. The chirped grating surface can be modelled using Zemax optical product design software.

The AOD of this example diffracts the light in the Y direction into null, −1 order and the several higher orders. The −1 order propagates to the image plane (substrate plane), while the remaining orders are blocked by a filtering aperture positioned downstream of the AOD. This aperture 249 can be inserted either inside the second expander 256 or inside the telescope lens 259 (as shown in FIG. 2). This aperture can act as a system aperture in X.

The frequency of the RF signal fed to the AOD is monotonically increasing (chirped) during the frequency scan sequence. For a particular printing speed configuration of the writer, the chirp value or rate of frequency change is constant, while the mean grating frequency varies within the range corresponding to the RF frequency bandwidth of the AOD. More details are provided below, in a comparison between operating characteristics of UV and DUV adapted devices.

The chirp causes a frequency difference over the length of the entrance aperture, which makes the angle of diffraction vary along Y, with one end of the elongated aperture diffracted more than the opposite end. This source of astigmatism is chirp-value dependent and uniform over the field. This astigmatism can be compensated by the use of a cylindrical lens (the Cylinder), which can be placed in positions indicated in FIG. 2 as Pos 1 (215), Pos 2 (217) and Pos 3 (269). The Cylinder placed in Pos 1 of the current machine would have a short focal length lens, which would make this position impractical. In other machines, Pos 1 could be practical. The available space also could be a problem in placing the Cylinder in Pos 2, although this position is preferred. If placed in Pos 3, the Cylinder lens rotation will have to be adjusted responsive to rotation angle of the Rotator 218.

Changing the chirp value and resulting astigmatism will involve changing the power of the Cylinder. Practically, this can be done by replacing the Cylinder with a lens of a different power.

A general, schematic arrangement of components is illustrated by FIG. 2. The first expander 253 begins with expander entrance 211. The radiation image that enters at the expander entrance is reshaped and projected to an entrance of the AOD 214. The AOD is followed by a second expander 256 that reshapes the rectangular image back to a circular writing spot at the second expander exit 226. Two potential positions for the Cylinder are before and after the second expander, at 215 and 217. A rotator 218 can be applied to change the orientation of the projected image from the second expander before reflection at the fold mirror 229. Alternatively, a rotator could be positioned after the fold mirror 229. The telescope 259 can include an aperture 249, as described above. The third potential position for the cylinder 269 is between the telescope and the final lens pupil 279. Final lens 289 is positioned after the final lens pupil 279.

In the illustrated arrangement, the −1 order light diffracted by the AOD is passing through the Cylinder and the second expander lens. The second expander image planes at exit are conjugated if there is no Cylinder between these planes and the chirp value is null. In the second expander image plane at exit, the beam is shaped back to a circular or low aspect ratio footprint. In one implementation, the resulting output size matches the input size, which minimizes redesign of other components. In other implementations, the output of the second expander need not match the input to the first expander.

The chief beams of all field points are angled in both X and Y directions in the expander exit plane. For a particular field point, the angle in X in this plane is identical to its angle in the expander entrance plane. The angle in Y is governed by the diffraction angle of the grating and the magnification of the second expander lens in this direction.

The rotation of the beam in the image plane is to be controlled by the rotator 218. Image rotation relates to the writing concept, which is not claimed in this disclosure.

The −1 order beam is relayed by the telescope lens to the pupil plane of the objective lens which focuses the beam in the final image plane (substrate plane). In the writer, the final lens is positioned so the image plane of the optical system and the substrate plane coincide. As the thickness of the substrates can vary, the Z position of the 'telescope+final lens' assembly will be adjusted accordingly by a separate Z actuator.

The expander lenses and the telescope lens may be accompanied by a beam path length adjusting device. This device could be integrated with the rotator. Alternatively, a separate retro reflector, also known as a trombone mirror, can be used.

The final lens design in the example illustrated has a numerical aperture NA=0.85. NA, f and D are related to each other as defined by the equations above. A lens working distance slightly greater than 2 mm accommodates space needed for a focus servo. This yields focal length f of 2.5-3.5 mm (in our case 2.85 mm) and pupil size of 4-6 mm (in our case 4.8 mm)

FIG. 3 illustrates the angular magnification and the imaging mechanism of the system, which includes AOD plane 312 and the planes for two cylindrical lenses, Lens 1 314 and Lens 2 317. The two cylindrical lenses are each comprised of an ensemble of several accurately aligned cylindrical lens elements. The beams (342, 352, 362) emerging from the AOD plane 312 at the angles ±α/2 (353) will intersect the exit pupil 319 at the angles ±β/2 (358) with a ratio β/α=F1/F2. The lenses are arranged in an 'f-f geometry' for which the separation between the AOD plane 312 and Lens 1 314 equals the focal length of the Lens 1 (F1 373, 375), the separation between the Lens 2 and the exit pupil equals the focal length of the Lens 2 (F2 376, 378) and the separation between Lens 1 314 and Lens 2 317 equals the sum of the focal lengths of these lenses.

FIG. 4 and FIG. 5 illustrate the beam geometry in the AOD scanning direction and in the plane perpendicular to the AOD scanning plane. FIG. 4 illustrates the beam geometry in the AOD scanning direction. The solid beams 456, long dashed beams 446 and short dashed beams 466 in three groups depict the laser beam trajectory which is deflected by the AOD 312 at some angles. In this example, deflection angles relate to driving the deflector with different frequencies. The reduction of the beam footprint size between the AOD and the exit pupil plane 319 is about 8× in this picture, which is the same as the magnification of the chief ray angles (353, 358) between the long dashed beams 446 and short dashed beams 466 between these planes. In other examples, a magnification of the chief ray angles can be in a range of 4:1 to 12:1.

FIG. 5 illustrates the beam geometry in the plane perpendicular to the AOD scanning plane. The solid beams 456a, 456c, long dashed beams 446a, 446c and short dashed beams 466a, 466c depict the axial and non-axial scanning beams. The beam size is much smaller (1 mm) in X than the size of the beam in the scanning direction Y (37 mm). This beam is imaged into the exit pupil plane 319 with the lenses Lens 3 (512) and Lens 4 (515). In this example, the beam size magnification in around 5. There may be 5 to 15 separate beams, or as many as 32 separate beams. The beams can be separated equidistance, or with a different separation pattern. These beams pass through the AOD. In one implementation, the aperture of the quartz AOD is 1 mm on X-axis and the original size of the beam is 4.8 mm. The original beam size is scaled to the aperture by the first expander and magnified back to the original or some other size by the second expander.

FIGS. 6-7 are example specifications for first and second expanders that could be used in procuring complex lens assemblies from vendors such as Zeiss, Nikon, Leica, Melles Griot, or Corning Tropel. The specifications for the first and second expanders are similar and reciprocal. The first expander is specified, in the FIG. 6 example, to receive the radiation source as a 4.8 mm Gaussian spot at the entrance pupil and to output it as a 37 mm×1 mm rectangle at the exit pupil, for projection onto the AOD. Mechanical aspects, such as track length and working distance, are specified that match a target pattern generator, but are not characteristic of the technology disclosed, which can be practiced in many physical configurations. Angular magnification in X and in Y helps produces the transformation from the input spot to the output rectangle. Transmission determines output power and to heat build-up in the expander.

The second expander is specified, in the FIG. 7 example, as generally reciprocal to the first expander, though this is not characteristic of the technology disclosed, because the output spot from the second expander need not match input to the first expander. The second expander receives the deflected radiation from the AOD as a 37 mm×1 mm rectangle at the entrance pupil and outputs it as a 4.8 mm Gaussian spot at the exit pupil. Mechanical aspects, such as track length and working distance, are specified that match a target pattern generator, but are not characteristic of the technology disclosed, which can be practiced in many physical configurations. Angular magnification in X and in Y helps produces the transformation from the input rectangle to the output spot. Transmission determines output power and to heat build-up in the expander.

FIG. 9 illustrates a second expander lens design in an example imaging system, with a perspective view 912, an X cross section 952 and a Y cross section 972, according to one implementation of the technology disclosed. Multiple lens elements, including cylindrical lens elements, are depicted. The number, position and power of the lens elements are likely to vary from one compound lens supplier to the next.

Advantages of the technology disclosed are apparent from a comparison between the inventive technology with designs relying on the legacy $TeO_2$ technology or relying on diffraction through quartz of a circular spot that fits the narrow side of the aperture. Some characteristics of the three designs are summarized in the following table:

| $TeO_2$ (current PG) | | |
| --- | --- | --- |
| Wavelength | 413 | nm |
| Bandwidth | 158 | MHz |
| Sound speed | 710 | m/s |
| Pupil size | 4.8 | mm |
| Focal length | 2.85 | mm |
| Sweep length | 261.94 | μm |
| Number of resolved spots | 762.98 | |
| Quartz 37 mm with Expanders | | |
| Wavelength | 266 | nm |
| Bandwidth | 190 | MHz |
| Sound speed | 6320 | m/s |
| Pupil size | 37 | mm |
| Focal length | 2.85 | mm |
| Expander 2 mag | 7.71 | |
| Sweep length | 175.68 | μm |
| Number of resolved spots | 794.53 | |
| Quartz 1 mm without Expanders | | |
| Wavelength | 266 | nm |
| Bandwidth | 190 | MHz |
| Sound speed | 6320 | m/s |
| Pupil size | 1 | mm |
| Focal length | 2.85 | mm |
| Sweep length | 22.79 | μm |
| Number of resolved spots | 21.47 | |

Comparing the technology disclosed with the legacy $TeO_2$ device used in current pattern generators, the new wavelength is in the DUV spectrum, whereas the old wavelength is UV. The speed of sound through quartz is approximately nine times faster than through $TeO_2$. The first and second expanders are new to the technology disclosed, with the magnification ratio in Y of 7.71. The writing spot width is narrower and capable of producing higher resolution features. As a result, the increased number of resolved spots, up from about 763 to about 795, still leave the sweep length shorter than before, 175.68 μm versus 261.94 μm, which is consistent with the reduced wavelength of the transmitted radiation. This is close enough to reuse many pattern generator components and produce a reasonable writing speed.

Comparing quartz AODs deflecting the high aspect ratio beam of the technology disclosed with deflecting a 1 mm round writing spot, the number of resolved spots is 37 times greater, about 795 resolved spots versus just 22 resolved spots. On this measure of merit, the technology disclosed significantly improves on conventional usage of a commercially available AOD.

Next, we describe a computer system usable for an acousto-optical deflector, a first expander before the AOD, a second expander following the AOD, and one or more additional lenses all aligned on an optical path.

Computer System

FIG. 8 is a simplified block diagram of a computer system 800 that can be used with an acousto-optical deflector and pattern generator, according to one implementation of the technology disclosed.

Computer system 800 includes at least one central processing unit (CPU) 872 that communicates with a number of peripheral devices via bus subsystem 855. These peripheral devices can include a storage subsystem 826 including, for example, memory devices and a file storage subsystem 836, user interface input devices 838, user interface output devices 876, and a network interface subsystem 874. The input and output devices allow user interaction with computer system 800. Network interface subsystem 874 provides an interface to outside networks, including an interface to corresponding interface devices in other computer systems.

User interface output devices 876 can include a display subsystem or non-visual displays such as audio output devices. The display subsystem can include an LED display, a flat-panel device such as a liquid crystal display (LCD), a projection device, a cathode ray tube (CRT), or some other mechanism for creating a visible image. The display subsystem can also provide a non-visual display such as audio output devices. In general, use of the term "output device" is intended to include all possible types of devices and ways to output information from computer system 800 to the user or to another machine or computer system.

Memory subsystem 822 used in the storage subsystem 826 can include a number of memories including a main random-access memory (RANI) 832 for storage of instructions and data during program execution and a read only memory (ROM) 834 in which fixed instructions are stored. A file storage subsystem 836 can provide persistent storage for program and data files, and can include a hard disk drive, a floppy disk drive along with associated removable media, a CD-ROM drive, an optical drive, or removable media cartridges. The modules implementing the functionality of certain implementations can be stored by file storage subsystem 836 in the storage subsystem 826, or in other machines accessible by the processor.

Bus subsystem 855 provides a mechanism for letting the various components and subsystems of computer system 800 communicate with each other as intended. Although bus subsystem 855 is shown schematically as a single bus, alternative implementations of the bus subsystem can use multiple busses.

Computer system 800 itself can be of varying types including a personal computer, a portable computer, a workstation, a computer terminal, a network computer, a television, a mainframe, a server farm, a widely-distributed set of loosely networked computers, or any other data processing system or user device. Due to the ever-changing nature of computers and networks, the description of computer system 800 depicted in FIG. 8 is intended only as a specific example for purposes of illustrating the preferred embodiments of the present invention. Many other configurations of computer system 800 are possible having more or less components than the computer system depicted in FIG. 8. The computer system can be used to control a microlithography laser writer, such as a laser writer for large area masks or smaller, semi-conductor masks. The microlithography writer can be a multi-beam writer.

The preceding description is presented to enable the making and use of the technology disclosed. Various modifications to the disclosed implementations will be apparent, and the general principles defined herein may be applied to other implementations and applications without departing from the spirit and scope of the technology disclosed. Thus, the technology disclosed is not intended to be limited to the implementations shown, but is to be accorded the widest scope consistent with the principles and features disclosed herein. The scope of the technology disclosed is defined by the appended claims.

Some Particular Implementations

Some particular implementations and features are described in the following discussion.

In one implementation, a disclosed imaging system includes an AOD, a first expander before the AOD, a second expander following the AOD, and one or more additional lenses all aligned on an optical path. The AOD has an entrance window with a high-aspect ratio in a range of 15:1 to 60:1, and an acousto-optical medium with a speed of sound along a scanning y direction of between 2500 and 11,225 m/s. The acousto-optical medium is transmissive to input radiation having a wavelength selected from a range of 225 to 350 nm. By transmissive we mean absorbing twenty percent or less, or better yet, ten percent or less of DUV radiation sent through acousto-optic media.

The disclosed first expander includes lenses that reshape the input radiation from a source to a high-aspect ratio beam and relays the high-aspect ratio beam to the AOD and the second expander includes lenses that reshape the high-aspect ratio beam from an AOD exit after deflection by the AOD to a writing spot (or a reading spot.) The additional lenses magnify a deflection angle at the AOD exit to a larger sweep angle of the writing spot along a radiation sensitive surface (or reading spot from an imaged surface.)

As an image capture, rather than a projection system, the disclosed second expander includes lenses that reshape a reading spot from an imaged surface to the high-aspect ratio beam at an AOD exit, subject to deflection by the AOD and the first expander includes lenses that reshape the radiation from the high-aspect ratio beam to the AOD to a detector. The additional lenses demagnify a deflection angle from a larger sweep angle of the reading spot along the imaged surface to a smaller sweep at the AOD exit. In addition, multiple detectors, such as a line camera, an area camera, a spectrometer, scatterometer or an interferometer can be used in a system that read from the workpiece instead of writing to it.

The system described in this section and other sections of the technology disclosed can include one or more of the following features and/or features described in connection with additional systems disclosed. In the interest of conciseness, the combinations of features disclosed in this application are not individually enumerated and are not repeated with each base set of features. The reader will understand how features identified in this method can readily be combined with sets of base features identified as implementations.

Some implementations of the disclosed imaging system include a beam splitter and alignment optics that cause multiple high aspect ratio beams to be relayed to the entrance of the AOD with an angular separation between respective beams in a range of 0.01 to 0.4 degrees. For some disclosed implementations of the imaging system, the additional lenses include an imaging lens that projects the writing spot onto a writing plane (or reads a reading spot from a reading plane in the same position) with a numerical aperture in a range of 0.06 to 0.875. In one implementation, the additional lenses include an imaging lens that projects the writing spot onto a writing plane (or reads a reading spot from a reading plane in the same position) with a numerical aperture of approximately 0.85, plus or minus 0.05. In one implementation of the imaging system, the writing (or reading) spot has a low aspect ratio in a range of 2:1 to 1:1.

In some implementations of the disclosed imaging system, the first expander elongates the writing (or reading) spot in the scanning y direction by a ratio in a range of 2:1 to 10 and narrows the writing (or reading) spot in an x direction by a ratio in a range of 1:1 to 1:10. In one implementation, the first expander elongates the writing (or reading) spot in the scanning y direction by a ratio of approximately 1:7.7 and narrows the writing (or reading) spot in an x direction by a ratio of approximately 1:4.85.

For the disclosed imaging system, the acousto-optical medium is quartz, fused silica or sapphire.

One implementation of the disclosed imaging system includes transducers acoustically coupled to the acousto-optical medium to drive the acousto-optical medium with a chirp pattern over a frequency span of 100 to 400 MHz with a center frequency span of 150 to 650 MHz. For some implementations of the disclosed imaging system, the high aspect ratio beam is relayed through the AOD within 0.5 degrees of a Bragg angle of the acousto-optical medium.

The imaging system can further include transducers acoustically coupled to the acousto-optical medium to drive the acousto-optical medium with a chirp pattern of approximately 250 MHz, plus or minus 1 MHz, with a center frequency of approximately 410 MHz, plus or minus 1 MHz.

For some implementations of the disclosed imaging system, a ratio of the larger sweep angle to the deflection angle is in a range of 4:1 to 12:1. For some implementations, the acousto-optical medium is transmissive to input radiation to an extent of absorbing no more than 10 percent of the input radiation. In other implementations, the acousto-optical medium is transmissive to input radiation to an extent of absorbing no more than 20 percent of the input radiation.

Other implementations include a microlithographic laser writer comprising the imaging system described supra. Yet other implementations include a metrology inspection system comprising the imaging system described supra.

One implementation of a disclosed method of writing to or reading from a surface of a workpiece includes using a stationary optical image device to form or collect related information and relaying information between the optical image device and the workpiece, including through a first expander between the optical image device and an acousto-optical deflector and through a second expander and additional lenses between the AOD and the workpiece. For the disclosed method, the AOD has a first, stationary image entrance window with a high-aspect ratio in a range of 15:1 to 60:1, an acousto-optical medium with a speed of sound along a scanning y direction of between 2500 and 11,225 m/s, and a second, scanned image entrance window that is scanned by the AOD, relative to the first entrance window and said acousto-optical medium is transmissive to input radiation having a wavelength selected from a range of 225 to 350 nm. The first expander includes lenses that reshape image data between the optical image device and the AOD to a high-aspect ratio image at the entrance window the AOD and the second expander includes lenses that reshape the high-aspect ratio image between the second entrance window of AOD and workpiece image on a surface of the workpiece. For the disclosed method, the additional lenses magnify a deflection angle at the second entrance window of the AOD to a larger sweep angle along the surface of the workpiece.

For some implementations of the disclosed method, the optical image device further includes a radiation source and a beam splitter and alignment optics that cause energy from the radiation source to reach the entrance of the AOD as multiple high aspect ratio beams with an angular separation between respective images in a range of 0.01 to 0.4 degrees. The disclosed method further comprises sweeping the energy processed through the first expander, the AOD, the second expander and the additional lenses across the surface of the workpiece as multiple writing spots. In some cases, the writing spots have a low aspect ratio in a range of 2:1 to 1:1. For some implementations of the disclosed method, the first expander elongates the energy in the scanning y direction by a ratio in a range of 2:1 to 10 and narrows the energy in an x direction by a ratio in a range of 1:1 to 1:10. For the disclosed method, the first expander elongates the energy in the scanning y direction by a ratio of approximately 1:7.7 and narrows the energy in an x direction by a ratio of approximately 1:4.85. For some implementations of the disclosed method, the optical image device further includes a sensor array for reading at least one image from the surface of the workpiece and further comprises illuminating the surface of the workpiece and sweeping the surface of the workpiece to read image information from the illuminated surface.

In one implementation, the disclosed method includes producing dark field illumination by illuminating the surface. In another implementation the method includes producing bright field illumination by illuminating the surface.

Another disclosed implementation includes a microlithographic laser writer practicing any of the methods described earlier, and yet another implementation includes a microlithographic metrology system practicing the methods described.

The technology disclosed can be practiced as a system, method, or article of manufacture. One or more features of an implementation can be combined with the base implementation. Implementations that are not mutually exclusive are taught to be combinable. One or more features of an implementation can be combined with other implementations.

Some further example embodiment will now be disclosed.

Embodiment 1. An imaging system including:
an acousto-optical deflector, abbreviated AOD, a first expander before the AOD, a second expander following the AOD, and one or more additional lenses all aligned on an optical path, wherein:
the AOD has an entrance window with a high-aspect ratio in a range of 15:1 to 60:1, and an acousto-optical medium with a speed of sound along a scanning y direction of between 2500 and 11,225 m/s, and said acousto-optical medium is transmissive to input radiation having a wavelength selected from a range of 225 to 350 nm;
the first expander includes lenses that reshape the input radiation from a source to a high-aspect ratio beam and relays the high-aspect ratio beam to the AOD;
the second expander includes lenses that reshape the high-aspect ratio beam from an AOD exit after deflection by the AOD to a writing spot or beam; and
the additional lenses magnify a deflection angle at the AOD exit to a larger sweep angle of the writing spot or beam along a radiation sensitive surface.

Embodiment 2. The imaging system of embodiment 1, further including:
a beam splitter and alignment optics that cause multiple high aspect ratio beams to be relayed to the entrance of the AOD with an angular separation between respective images in a range of 0.01 to 0.4 degrees.

Embodiment 3. The imaging system of embodiment 1, wherein the additional lenses include an imaging lens that projects the writing spot or beam onto a writing plane with a numerical aperture in a range of 0.06 to 0.875.

Embodiment 4. The imaging system of embodiment 1, wherein the additional lenses include an imaging lens that projects the writing spot or beam onto a writing plane with a numerical aperture of approximately 0.85.

Embodiment 5. The imaging system of any of embodiments 1 to 4, wherein the writing spot or beam has a low aspect ratio in a range of 2:1 to 1:1.

Embodiment 6. The imaging system of any of embodiments 1 to 5, wherein the first expander elongates the writing spot or beam in the scanning y direction by a ratio in a range of 2:1 to 10 and narrows the writing spot or beam in an x direction by a ratio in a range of 1:1 to 1:10.

Embodiment 7. The imaging system of any of embodiment 1 to 6, wherein the first expander elongates the writing spot or beam in the scanning y direction by a ratio of approximately 1:7.7 and narrows the writing spot or beam in an x direction by a ratio of approximately 1:4.85.

Embodiment 8. The imaging system of any of embodiment 1 to 7, wherein the acousto-optical medium is quartz, fused silica or sapphire.

Embodiment 9. The imaging system of any of embodiments 1 to 8, further including transducers acoustically coupled to the acousto-optical medium to drive the acousto-optical medium with a chirp pattern over a frequency span of 100 to 400 MHz with a center frequency span of 150 to 650 MHz.

Embodiment 10. The imaging system of any of embodiments 1 to 9, wherein the high aspect ratio beam is relayed through the AOD within 0.5 degrees of a Bragg angle of the acousto-optical medium.

Embodiment 11. The imaging system of any of embodiments 1 to 8 or 10, further including transducers acoustically coupled to the acousto-optical medium to drive the acousto-optical medium with a chirp pattern of approximately 250 MHz with a center frequency of approximately 410 MHz.

Embodiment 12. The imaging system of embodiment 1, wherein a ratio of the larger sweep angle to the deflection angle is in a range of 4:1 to 12:1.

Embodiment 13. The imaging system of any of embodiments 1 to 12, wherein acousto-optical medium is transmissive to input radiation to an extent of absorbing no more than 10 percent of the input radiation.

Embodiment 14. The imaging system of any of embodiments 1 to 12, wherein acousto-optical medium is transmissive to input radiation to an extent of absorbing no more than 20 percent of the input radiation.

Embodiment 15. A microlithographic laser writer comprising the imaging system of any of embodiments 1 to 14.

Embodiment 16. An method of writing an image to a radiation sensitive surface, the method including using an acousto-optical deflector, abbreviated AOD, a first expander before the AOD, a second expander following the AOD, and one or more additional lenses all aligned on an optical path, wherein:
the AOD has an entrance window with a high-aspect ratio in a range of 15:1 to 60:1, and an acousto-optical medium with a speed of sound along a scanning y direction of between 2500 and 11,225 m/s, and said acousto-optical medium is transmissive to input radiation having a wavelength selected from a range of 225 to 350 nm;
the first expander includes lenses that reshape the input radiation from a source to a high-aspect ratio beam and relays the high-aspect ratio beam to the AOD;
the second expander includes lenses that reshape the high-aspect ratio beam from an AOD exit after deflection by the AOD to a writing spot or beam; and
the additional lenses magnify a deflection angle at the AOD exit to a larger sweep angle of the writing spot or beam along a radiation sensitive surface.

Embodiment 17. The method of embodiment 16, further including:
a beam splitter and alignment optics that cause multiple high aspect ratio beams to be relayed to the entrance of the AOD with an angular separation between respective images in a range of 0.01 to 0.4 degrees.

Embodiment 18. The method of embodiment 16, wherein the additional lenses include an imaging lens that projects the writing spot or beam onto a writing plane with a numerical aperture in a range of 0.06 to 0.875.

Embodiment 19. The method of embodiment 16, wherein the additional lenses include an imaging lens that projects the writing spot or beam onto a writing plane with a numerical aperture of approximately 0.85.

Embodiment 20. The method of any of embodiments 16 to 19, wherein the writing spot or beam has a low aspect ratio in a range of 2:1 to 1:1.

Embodiment 21. The method of any of embodiments 16 to 20, wherein the first expander elongates the writing spot or beam in the scanning y direction by a ratio in a range of 2:1 to 10 and narrows the writing spot or beam in an x direction by a ratio in a range of 1:1 to 1:10.

Embodiment 22. The method of any of embodiment 16 to 21, wherein the first expander elongates the writing spot or beam in the scanning y direction by a ratio of approximately 1:7.7 and narrows the writing spot or beam in an x direction by a ratio of approximately 1:4.85.

Embodiment 23. The method of any of embodiment 16 to 22, wherein the acousto-optical medium is quartz, fused silica or sapphire.

Embodiment 24. The method of any of embodiments 16 to 23, further including:
transducers acoustically coupled to the acousto-optical medium to drive the acousto-optical medium with a chirp pattern over a frequency span of 100 to 400 MHz with a center frequency span of 150 to 650 MHz.

Embodiment 25. The method of any of embodiments 16 to 24, wherein the high aspect ratio beam is relayed through the AOD within 0.5 degrees of a Bragg angle of the acousto-optical medium.

Embodiment 26. The method of any of embodiments 16 to 23 or 25, further including:
transducers acoustically coupled to the acousto-optical medium to drive the acousto-optical medium with a chirp pattern of approximately 250 MHz with a center frequency of approximately 410 MHz.

Embodiment 27. The method of embodiment 16, wherein a ratio of the larger sweep angle to the deflection angle is in a range of 4:1 to 12:1.

Embodiment 28. The method of any of embodiments 16 to 27, wherein acousto-optical medium is transmissive to input radiation to an extent of absorbing no more than 10 percent of the input radiation.

Embodiment 29. The method of any of embodiments 16 to 27, wherein acousto-optical medium is transmissive to input radiation to an extent of absorbing no more than 20 percent of the input radiation.

Embodiment 30. A microlithographic laser writer comprising the method of any of embodiments 16 to 29.

Embodiment 31. A method of writing to or reading from a surface of a workpiece, the method including:
using an optical image device to form or collect related information;
relaying information between the optical image device and the workpiece, including through a first expander between the optical image device and an acousto-optical deflector, abbreviated AOD, and through a second expander and additional lenses between the AOD and the workpiece, wherein:
the AOD has a first, stationary image entrance window with a high-aspect ratio in a range of 15:1 to 60:1, an acousto-optical medium with a speed of sound along a scanning y direction of between 2500 and 11,225 m/s, and a second, scanned image entrance window that is scanned by the AOD, relative to the first entrance window;
said acousto-optical medium is transmissive to input radiation having a wavelength selected from a range of 225 to 350 nm;
the first expander includes lenses that reshape image data between the optical image device and the AOD to a high-aspect ratio image at the first entrance window of the AOD;
the second expander includes lenses that reshape the high-aspect ratio image between the second entrance window of the AOD and workpiece image on a surface of the workpiece; and the additional lenses magnify a deflection angle at the second entrance window of the AOD to a larger sweep angle along the surface of the workpiece.

Embodiment 32. The method of embodiment 31, wherein the optical image device further includes:
a radiation source; and
a beam splitter and alignment optics that cause energy from the radiation source to reach the entrance of the AOD as multiple high aspect ratio beams with an angular separation between respective images in a range of 0.01 to 0.4 degrees; and
the method further comprising sweeping the energy processed through the first expander, the AOD, the second expander and the additional lenses across the surface of the workpiece as multiple writing spots.

Embodiment 33. The method of embodiment 32, wherein the writing spots have a low aspect ratio in a range of 2:1 to 1:1.

Embodiment 34. The method of any of embodiments 32 to 33, wherein the first expander elongates the energy in the scanning y direction by a ratio in a range of 2:1 to 10 and narrows the energy in an x direction by a ratio in a range of 1:1 to 1:10.

Embodiment 35. The method of any of embodiments 32 to 34, wherein the first expander elongates the energy in the scanning y direction by a ratio of approximately 1:7.7 and narrows the energy in an x direction by a ratio of approximately 1:4.85.

Embodiment 36. The method of embodiment 31, wherein the optical image device further includes:
a sensor array for reading at least one image from the surface of the workpiece; and
the method further comprising illuminating the surface of the workpiece and sweeping the surface of the workpiece to read image information from the illuminated surface.

Embodiment 37. The method of embodiment 36, further including producing dark field illumination by illuminating the surface.

Embodiment 38. The method of embodiment 36, further including producing bright field illumination by illuminating the surface.

Embodiment 39. The method of any of embodiments 31 to 38, wherein the additional lenses include an imaging lens that relays image information between the second expander lenses and the surface of the workpiece with a numerical aperture in a range of 0.06 to 0.875.

Embodiment 40. The method of any of embodiments 31 to 39, wherein the additional lenses include an imaging lens that relays image information between the second expander lenses and the surface of the workpiece with a numerical aperture of approximately 0.85.

Embodiment 41. The method of any of embodiment 31 to 40, wherein the acousto-optical medium is quartz, fused silica or sapphire.

Embodiment 42. The method of any of embodiments 31 to 41, further including transducers acoustically coupled to the acousto-optical medium to drive the acousto-optical medium with a chirp pattern over a frequency span of 100 to 400 MHz with a center frequency span of 150 to 650 MHz.

Embodiment 43. The method of any of embodiments 31 to 42, wherein the high aspect ratio beam is relayed through the AOD within 0.5 degrees of a Bragg angle of the acousto-optical medium.

Embodiment 44. The method of any of embodiments 31 to 41 or 43, further including transducers acoustically coupled to the acousto-optical medium to drive the acousto-optical medium with a chirp pattern of approximately 250 MHz with a center frequency of approximately 410 MHz.

Embodiment 45. The method of any of embodiments 31 to 44, wherein a ratio of the larger sweep angle to the deflection angle is in a range of 4:1 to 12:1.

Embodiment 46. The method of any of embodiments 31 to 45, wherein the acousto-optical medium is transmissive to input radiation to an extent of absorbing no more than 10 percent of the input radiation.

Embodiment 47. The method of any of embodiments 31 to 46, wherein the acousto-optical medium is transmissive to input radiation to an extent of absorbing no more than 20 percent of the input radiation.

Embodiment 48. A microlithographic laser writer practicing the method of any of embodiments 31 to 35 or 39 to 47.

Embodiment 49. A microlithographic metrology system practicing the method of any of embodiments 40 or 36 to 47.

Embodiment 50. An imaging system for writing to or reading from a surface of a workpiece, comprising:
an optical image device used to form or collect related information;
information relayed between the optical image device and the workpiece, including through a first expander between the optical image device and an acousto-optical deflector, abbreviated AOD, and through a second expander and additional lenses between the AOD and the workpiece, wherein:
the AOD has a first, stationary image entrance window with a high-aspect ratio in a range of 15:1 to 60:1, an acousto-optical medium with a speed of sound along a scanning y direction of between 2500 and 11,225 m/s, and a second, scanned image entrance window that is scanned by the AOD, relative to the first entrance window;
said acousto-optical medium is transmissive to input radiation having a wavelength selected from a range of 225 to 350 nm;
the first expander includes lenses that reshape image data between the optical image device and the AOD to a high-aspect ratio image at the entrance window of the AOD;
the second expander includes lenses that reshape the high-aspect ratio image between the second entrance window of the AOD and workpiece image on a surface of the workpiece; and
the additional lenses magnify a deflection angle at the second entrance window of the AOD to a larger sweep angle along the surface of the workpiece.

Embodiment 51. The imaging system of embodiment 50, wherein the optical image device further includes:
a radiation source; and
a beam splitter and alignment optics that cause energy from the radiation source to reach the entrance of the AOD as multiple high aspect ratio beams with an angular separation between respective images in a range of 0.01 to 0.4 degrees; and
the imaging system further sweeping the energy processed through the first expander, the AOD, the second expander and the additional lenses across the surface of the workpiece as multiple writing spots.

Embodiment 52. The imaging system of embodiment 51, wherein the writing spots or beams have a low aspect ratio in a range of 2:1 to 1:1.

Embodiment 53. The imaging system of any of embodiments 51 to 52, wherein the first expander elongates the energy in the scanning y direction by a ratio in a range of 2:1 to 10 and narrows the energy in an x direction by a ratio in a range of 1:1 to 1:10.

Embodiment 54. The imaging system of any of embodiments 51 to 53, wherein the first expander elongates the energy in the scanning y direction by a ratio of approximately 1:7.7 and narrows the energy in an x direction by a ratio of approximately 1:4.85.

Embodiment 55. The imaging system of embodiment 50, wherein the optical image device further includes:
a sensor array for reading at least one image from the surface of the workpiece; and
the imaging system further illuminating the surface of the workpiece and sweeping the surface of the workpiece to read image information from the illuminated surface.

Embodiment 56. The imaging system of embodiment 55, further including producing dark field illumination by illuminating the surface.

Embodiment 57. The imaging system of embodiment 55, further including producing bright field illumination by illuminating the surface.

Embodiment 58. The imaging system of any of embodiments 50 to 57, wherein the additional lenses include an imaging lens that relays image information between the second expander lenses and the surface of the workpiece with a numerical aperture in a range of 0.06 to 0.875.

Embodiment 59. The imaging system of any of embodiments 50 to 58, wherein the additional lenses include an imaging lens that relays image information between the second expander lenses and the surface of the workpiece with a numerical aperture of approximately 0.85.

Embodiment 60. The imaging system of any of embodiment 50 to 59, wherein the acousto-optical medium is quartz, fused silica or sapphire.

Embodiment 61. The imaging system of any of embodiments 50 to 60, further including transducers acoustically coupled to the acousto-optical medium to drive the acousto-optical medium with a chirp pattern over a frequency span of 100 to 400 MHz with a center frequency span of 150 to 650 MHz.

Embodiment 62. The imaging system of any of embodiments 50 to 61, wherein the high aspect ratio beam is relayed through the AOD within 0.5 degrees of a Bragg angle of the acousto-optical medium.

Embodiment 63. The imaging system of any of embodiments 50 to 60 or 62, further including transducers acoustically coupled to the acousto-optical medium to drive the acousto-optical medium with a chirp pattern of approximately 250 MHz with a center frequency of approximately 410 MHz.

Embodiment 64. The imaging system of any of embodiments 50 to 63, wherein a ratio of the larger sweep angle to the deflection angle is in a range of 4:1 to 12:1.

Embodiment 65. The imaging system of any of embodiments 50 to 64, wherein acousto-optical medium is transmissive to input radiation to an extent of absorbing no more than 10 percent of the input radiation.

Embodiment 66. The imaging system of any of embodiments 50 to 65, wherein acousto-optical medium is transmissive to input radiation to an extent of absorbing no more than 20 percent of the input radiation.

While the technology disclosed is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the innovation and the scope of the following claims.

The invention claimed is:

1. An imaging system including:
an acousto-optical deflector, abbreviated AOD, a first expander before the AOD, a second expander following the AOD, and one or more additional lenses all aligned on an optical path, wherein:
the AOD has an entrance window with a high-aspect ratio in a range of 15:1 to 60:1, and an acousto-optical medium with a speed of sound along a scanning y direction of between 2500 and 11,225 m/s, and said acousto-optical medium is transmissive to input radiation having a wavelength selected from a range of 225 to 350 nm;
the first expander includes lenses that reshape the input radiation from a source to a high-aspect ratio beam and relays the high-aspect ratio beam to the AOD;
the second expander includes lenses that reshape the high-aspect ratio beam from an AOD exit after deflection by the AOD to a writing beam; and
the additional lenses magnify a deflection angle at the AOD exit to a larger sweep angle of the writing beam along a radiation sensitive surface.

2. The imaging system of claim 1, further including:
a beam splitter and alignment optics that cause multiple high aspect ratio beams to be relayed to the entrance of the AOD with an angular separation between respective images in a range of 0.01 to 0.4 degrees.

3. The imaging system of claim 1, wherein:
the additional lenses include an imaging lens that projects the writing beam onto a writing plane with a numerical aperture in a range of 0.06 to 0.875.

4. The imaging system of claim 1, wherein:
the writing beam has a low aspect ratio in a range of 2:1 to 1:1.

5. The imaging system of claim 1, wherein:
the first expander elongates the writing beam in the scanning y direction by a ratio in a range of 2:1 to 10:1 and narrows the writing beam in an x direction by a ratio in a range of 1:1 to 1:10.

6. The imaging system of claim 1, wherein:
the first expander elongates a writing spot in the scanning y direction by a ratio of approximately 1:7.7 and narrows the writing spot in an x direction by a ratio of approximately 1:4.85.

7. The imaging system of claim 1, wherein:
the acousto-optical medium is quartz, fused silica or sapphire.

8. The imaging system of claim 1, further including:
one or more transducers acoustically coupled to the acousto-optical medium to drive the acousto-optical medium with a chirp pattern over a frequency span of 100 to 400 MHz with a center frequency of 150 to 650 MHz.

9. The imaging system of claim 1, wherein:
the high aspect ratio beam is relayed through the AOD within 0.5 degrees of a Bragg angle of the acousto-optical medium.

10. The imaging system of claim 1, wherein:
a ratio of the larger sweep angle to the deflection angle is in a range of 4:1 to 12:1.

11. The imaging system of claim 1, wherein:
the acousto-optical medium is transmissive to input radiation to an extent of absorbing no more than 20 percent of the input radiation.

12. A microlithographic laser writer comprising the imaging system of claim 1.

13. A method of writing an image to a radiation sensitive surface, the method including:

using an acousto-optical deflector, abbreviated AOD, a first expander before the AOD, a second expander following the AOD, and one or more additional lenses all aligned on an optical path, wherein the AOD has an entrance window with a high-aspect ratio in a range of 15:1 to 60:1, and an acousto-optical medium with a speed of sound along a scanning y direction of between 2500 and 11,225 m/s, and said acousto-optical medium is transmissive to input radiation having a wavelength selected from a range of 225 to 350 nm;

reshaping, by lenses included in the first expander, the input radiation from a source to a high-aspect ratio beam and relays the high-aspect ratio beam to the AOD;

reshaping, by lenses included in the second expander, the high-aspect ratio beam from an AOD exit after deflection by the AOD to a writing beam; and magnifying, by the additional lenses, a deflection angle at the AOD exit to a larger sweep angle of the writing beam along a radiation sensitive surface.

14. The method of claim 13, further including:

relaying multiple high aspect ratio beams, via a beam splitter and alignment optics, to the entrance of the AOD with an angular separation between respective images in a range of 0.01 to 0.4 degrees.

15. The method of claim 13, wherein the additional lenses include an imaging lens, the method further comprising:

projecting, by the imaging lens with a numerical aperture in a range of 0.06 to 0.875, the writing beam onto a writing plane.

* * * * *